United States Patent
Black et al.

(10) Patent No.: US 6,265,314 B1
(45) Date of Patent: *Jul. 24, 2001

(54) WAFER EDGE POLISH

(75) Inventors: Hang Thi Yen Black; Edward E. Ehrichs, both of Austin, TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,376

(22) Filed: Jun. 9, 1998

(51) Int. Cl.$^7$ .................................................. H01L 21/302
(52) U.S. Cl. .................... 438/690; 438/691; 438/959; 451/259
(58) Field of Search ..................... 438/691, 692, 438/701, 959, 690; 451/259

(56) References Cited

U.S. PATENT DOCUMENTS

| | | | |
|---|---|---|---|
| 5,185,965 | * | 2/1993 | Ozaki ........................................ 51/283 |
| 5,426,073 | * | 6/1995 | Imaoka et al. ......................... 438/597 |
| 5,657,537 | * | 8/1997 | Saia et al. ............................... 29/830 |
| 5,691,248 | * | 11/1997 | Cronin et al. ......................... 438/109 |
| 5,972,802 | * | 10/1999 | Nakano et al. ........................ 438/770 |

* cited by examiner

Primary Examiner—Benjamin L. Utech
Assistant Examiner—Kin-Chan Chen
(74) Attorney, Agent, or Firm—Williams, Morgan & Amerson

(57) ABSTRACT

The present invention is directed to a method for manufacturing semiconductor devices. The method generally comprises forming a plurality of process layers on a wafer 14. The wafer has an edge region 20 with a number of defects 26 existing thereon. Thereafter, the method comprises removing all or a substantial portion of the defects 26 on the edge region 20 of the wafer 14.

23 Claims, 4 Drawing Sheets

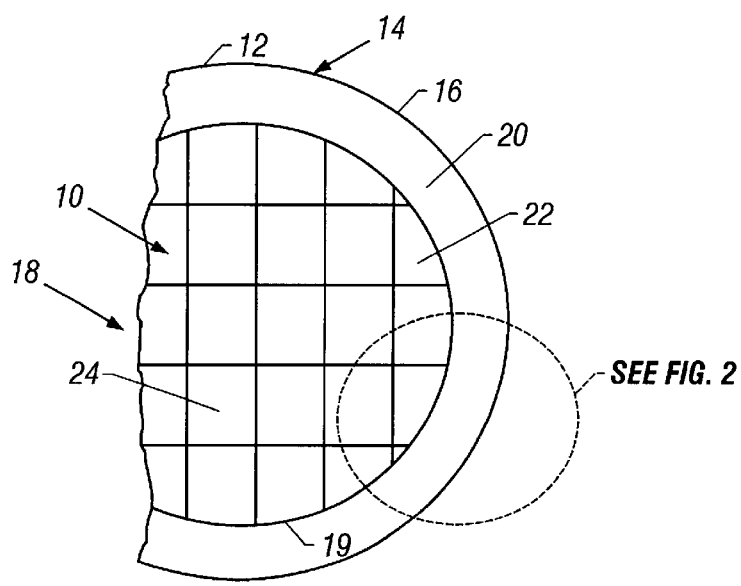
FIG. 1
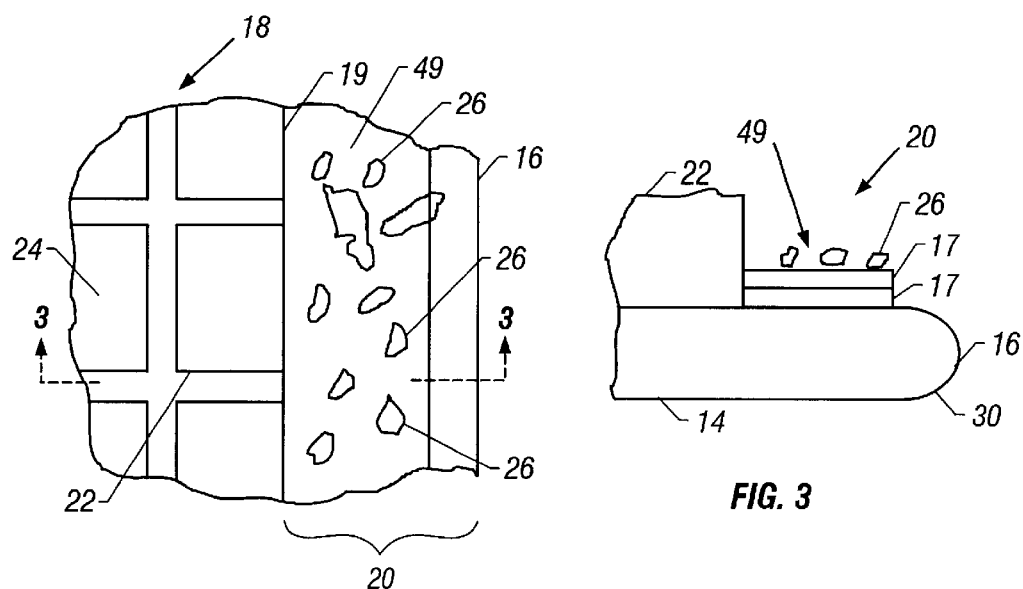
FIG. 2
FIG. 3

WAFER EDGE POLISH

BACKGROUND OF THE INVENTION

1. FIELD OF THE INVENTION

This invention generally relates to semiconductor processing, and, more particularly, to the manufacturing of semiconductor devices.

2. DESCRIPTION OF THE RELATED ART

Generally speaking, semiconductor devices are manufactured by forming a number of layers or films of material on a semiconductor substrate, typically called a wafer, and patterning these layers or films to form the desired electrical devices, e.g., transistors, capacitors, etc. However, there are many irregularities and defects that exist on or near the edge region of the wafer.

For example, the various process layers formed at or near the edge region of the wafer, or portions thereof, may not adhere very well and may be too thick or too thin. Additionally, in the edge regions of the wafer, process layers may be stacked on previous layers with which they are incompatible, process layers may be only partially formed, and removal of process layers (when desired) may be incomplete. These problems may result in holes being formed in the layers, as well as layers flaking or breaking, thereby increasing the amount of contaminants that are available to interfere with the fabrication of semiconductor devices. Such irregularities and defects may also lead to delaminations of the layers and cause cracks that may propagate from the edge region of the wafer into the main body of the wafer during subsequent processing of the wafer.

The irregularities and defects that may occur at the edge region of a wafer may occur for a number of reasons. For example, in high-temperature processes normally encountered in semiconductor manufacturing, such as in tube furnaces, there is always some temperature variation across the wafer. These variations may be greater at the wafer's outer edges where cooling and heating may occur more rapidly. Additionally, repeated touching and handling of the wafer during manufacturing operations is another reason that irregularities and defects may occur at the wafer's edge. The edge of the wafer may also contain a variety of defects due to various process steps. For example, the edge of the wafers may sometimes be subjected to clamping during various process steps. This clamping may leave marks, indentions, cracks or scratches on the layers at the edge of the wafer.

Problems and defects such as those discussed above are even more troublesome as features sizes on semiconductor devices become smaller and smaller. Generally speaking, smaller feature sizes require cleaner manufacturing environments, i.e., the number of contaminants in the manufacturing environment must be reduced. In turn this requires that all potential sources of contaminants, including those originating at the wafer's edge, must be reduced or eliminated.

The present invention is directed to a method and device that solves some or all of the aforementioned problems.

SUMMARY OF THE INVENTION

The present invention is directed to a method for manufacturing semiconductor devices. The method generally comprises forming a plurality of process layers on a wafer having an edge region with a number of defects existing thereon. Thereafter, the method comprises removing all or a substantial portion of the defects existing on the edge region of the wafer.

BRIEF DESCRIPTION OF THE DRAWINGS

The invention may be understood by reference to the following description taken in conjunction with the accompanying drawings, in which like reference numerals identify like elements, and in which:

FIG. 1 is a plan view of an illustrative semiconductor wafer with a plurality of partially-formed chips on the substrate;

FIG. 2 is an enlarged plan view of a portion of the device shown in FIG. 1;

FIG. 3 is a side view of the device shown in FIG. 2;

Figure 4:
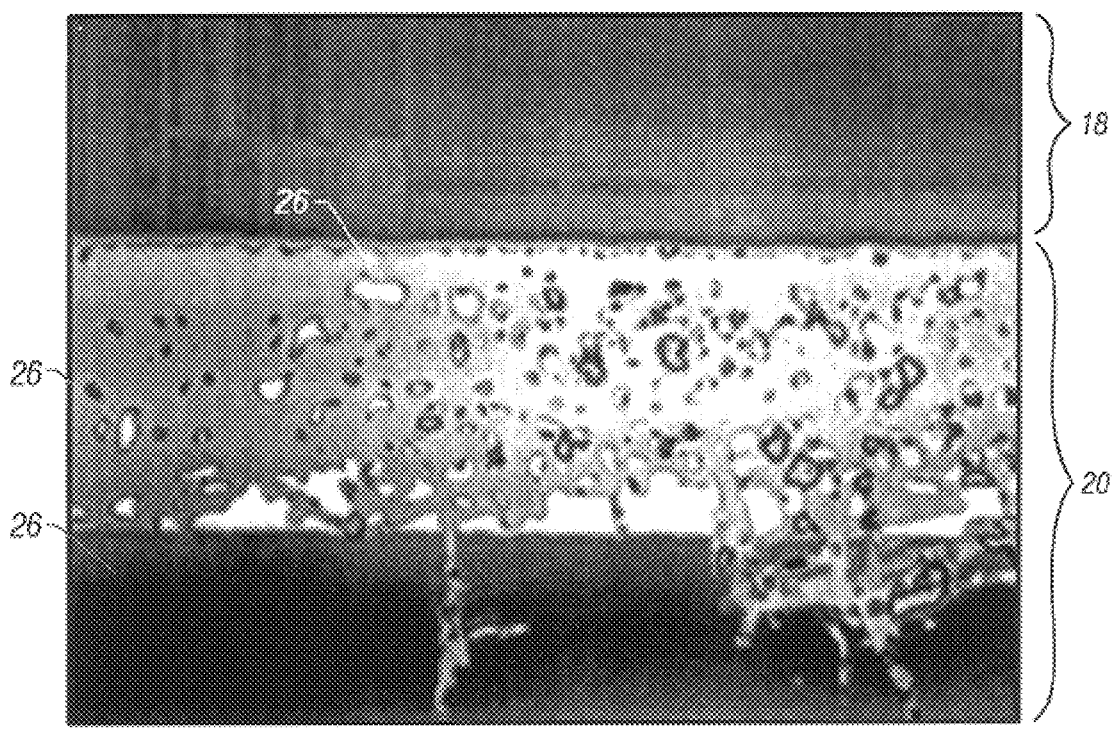
FIG. 4 is a photograph of the edge region of a semiconductor wafer taken with an optical microscope that shows a number of illustrative defects existing on the edge region of the wafer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As shown in FIG. 1, a plurality of chips or dies 10 may be fabricated on a semiconducting substrate 12. Normally, the semiconducting substrate 12 is a wafer 14 that has an edge 16 and a field region 18. The field region 18 is the region of the wafer 14 where the plurality of chips 10 are formed. The field region 18 may be considered to have an outer edge 19. The wafer 14 further comprises an edge region 20 that lies between the outer edge 19 of the field region 18 and the edge 16 of the wafer 14. As shown in FIG. 1, a plurality of chips 10 may be formed in the field region 18 of the wafer 14. A wafer 14 may include a plurality of edge chips 22, which will never be used as functioning devices, and whole chips 24, which will eventually be made into functioning semiconductor devices.

Generally speaking, semiconductor devices are made by the continual formation of a plurality of process layers or films (not shown) on a wafer 14, selective removal of portions of these layers, and selective addition of dopant materials to the substrate 12 to form the desired electrical device, such as a transistor or a capacitor, etc. Those skilled in the art recognize that the process layers used to make semiconductor devices may be formed by a variety of techniques, for example, chemical vapor deposition, thermal growing, sputtering, etc., and that the layers may be comprised of any number of materials, such as oxide layers, nitride layers, polysilicon layers, metal layers, etc.

FIGS. 2 and 3 are enlarged views of a portion of a wafer 14 having a number of illustrative defects 26 formed on the edge region 20 of the wafer 14. Such illustrative defects 26 may be located on the edge region 20 of the wafer 14 at any time during the fabrication process. Although the defects 26 depicted in the drawings are particles, the defects 26 also include irregularities in process layers such as, for example, holes in a process layer.

As shown in FIGS. 2 and 3, the edge region 20 of the wafer 14 has a top surface 49. The top surface 49 undergoes constant change during the course of manufacturing semiconductor devices. Initially, the top surface 49 is the top surface of the substrate 12 or, for example, an epitaxial layer of silicon dioxide formed on the substrate 12. However, during manufacturing operations, various illustrative process layers or films 17 are added and, when desired, removed on a continual basis until the formation of the semiconductor devices is completed. Moreover, although the top surface 49 is generally planar, there may be some irregularities in the top surface 49. For example, on a microscopic level, the top surface 49 of the edge region 20 may have steps or discontinuities, or may be wavy due to process layers conforming to underlying structure (desired or undesired) on the edge region 20 of the wafer 14. Additionally, those skilled in the art will recognize that the process layers or films 17 formed on the edge region 20 of the wafer 14 may be only partially formed and may have holes formed therein. The process layers or films 17 may be incomplete due to problems encountered in the initial formation of the process layers or films 17, or as a result of less than complete removal of the layers during normal processing operations.

The edge 16 of the wafer 14 is also typically formed by the wafer supplier to have a formed end 30. The shape of the formed end 30 may vary, but it is usually rounded, as shown in FIG. 3. For an 8 inch diameter wafer, the width of the edge region 20 ranges between approximately 2 and 10 mm. Of course, the width of the edge region 20 varies somewhat around the circumference of the wafer 14. Additionally, as those skilled in the art recognize, the width of the edge region 20 may vary with the nominal diameter of the wafer 14. For example, if the diameter of the wafer 14 increases, the width of the edge region 20 may decrease.

Figure 5:
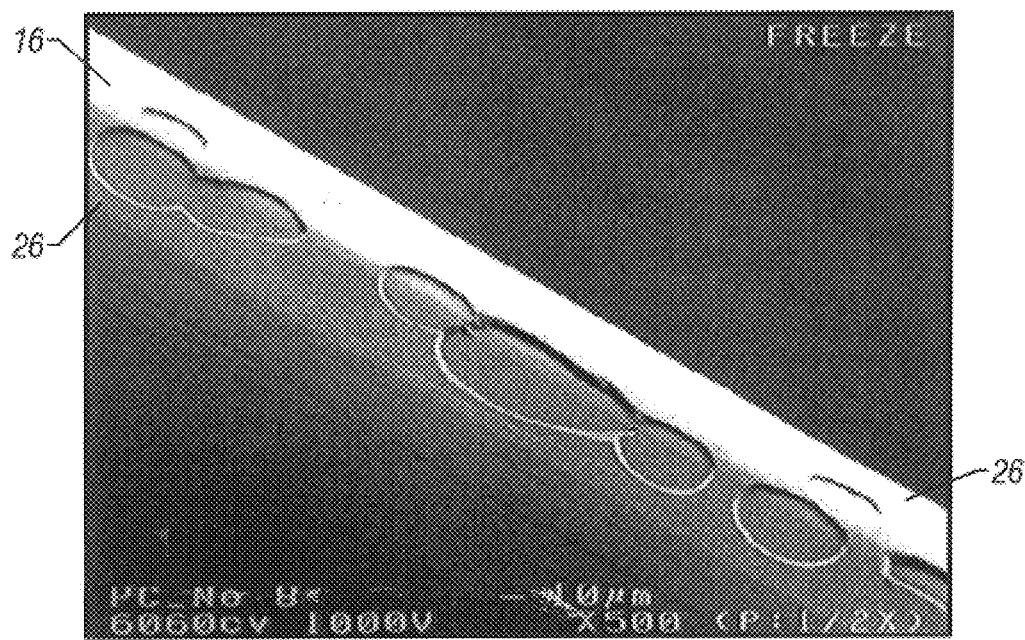
FIG. 5 is a photograph of the edge of an illustrative semiconductor wafer taken with an optical microscope that shows a number of illustrative defects.

FIG. 4 is a photograph of the edge region 20 of a wafer 14 taken with an optical microscope. This photograph of the edge region 20 of an illustrative wafer 14 shows a number of illustrative defects 26 that may exist on the edge region 20 of the wafer 14 during various stages of manufacturing. FIG. 5 is another photograph of the edge region 20 of an illustrative wafer 14 taken with an optical microscope showing a plurality of illustrative defects 26. These defects 26 may arise in a number of ways. For example, in the area of the wafer 14 adjacent the edge region 20, process layers may not adhere as well to adjacent layers, there may be incomplete removal of previously formed process layers, the layers may be formed too thick or too thin, and process layers may be formed over layers that are not supposed to contact one another, etc.

These defects 26 may result in numerous problems during the manufacture of semiconductor devices. For example, portions of incompletely removed or incompletely formed process layers on or near the edge region 20 may flake or pop off, thereby increasing the amount of contaminants available to adversely affect other semiconductor devices being manufactured on the wafer. Additionally, process layers formed on or near the edge region 20 of the wafer 14 can have delaminations (not shown) which may, upon further processing of the wafer 14, propagate further into the field region 18 of the wafer 14, thereby damaging the semiconductor devices under construction. As a result, it is desirable to remove the defects 26 existing on the edge region 20 and, if desired, to remove preexisting process layers that are formed on the edge region 20 of the wafer 14.

Figure 6:
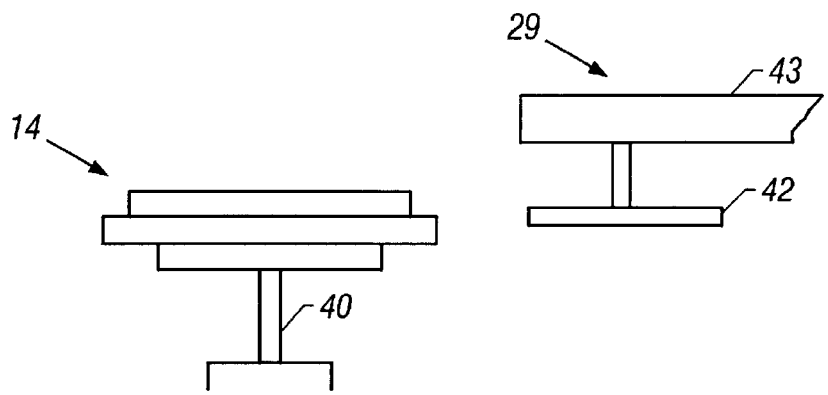
FIG. 6 is a sketch showing one illustrative technique to manufacture a semiconductor device using the present invention.

The present invention is directed to removing all or a substantial portion of the defects 26 existing on or near the edge region 20 of the wafer 14. FIG. 6 illustrates one illustrative embodiment of a technique for accomplishing this result using a cleaning device 29. In one illustrative embodiment, the cleaning device 29 may be comprised of a wheel 42 driven, for example, by a motor 43. The wafer 14 may be attached to a rotating chuck 40 and the wheel 42 may thereafter be brought into contact with all or a portion of the edge region 20 and/or edge 16 of the wafer 14. The precise processing parameters for the removal of defects 26 from the edge region 20 of the wafer 14 is a matter of design choice. However, the removal of defects 26 from the edge region 20 may be accomplished by a variety of processes, including, but not limited to, polishing, grinding or chemical mechanical polishing.

In one embodiment, the defects 26 and/or process layers 17 existing on the edge region 20 of the wafer 14 may be removed by subjecting the wafer edge region 20 and/or wafer edge 16 to a chemical mechanical polishing process. The precise process parameters, such as the speed of rotation (if any) of the wafer 14, the speed and direction of rotation of the wheel 42, the wheel 42 material, the polishing slurry or compound (if any), the pressure exerted by the wheel 42 or the wafer 14, the length of time the wafer 14 is polished, etc., are all matters of design choice. As those skilled in the art will recognize, these process parameters, and perhaps others, may vary depending upon a number of process variables, including, but not limited to, wafer size, wafer material, the width of the edge region, the size, nature and number of defects present, the amount of defects desired to be removed, etc.

What is important is that the edge region 20 of the wafer 14 be subjected to a processing step, such as, for example, a chemical mechanical polishing step, to remove all, substantially all, or a portion of the defects 26 and/or process layers 17 existing on or near the edge region 20 of the wafer 14. That is, an affirmative process step is taken to address the problem of the defects 26 and/or irregularities in the process layers 17 that are located on or near the edge region 20 of the wafer 14. By taking this affirmative step, the amount of defects 26 that find their way into the field region 18 of the wafer 14 may be reduced. In turn, this will result in fewer chips 10 becoming disabled as a result of contaminants in the manufacturing environment.

Figure 6A:
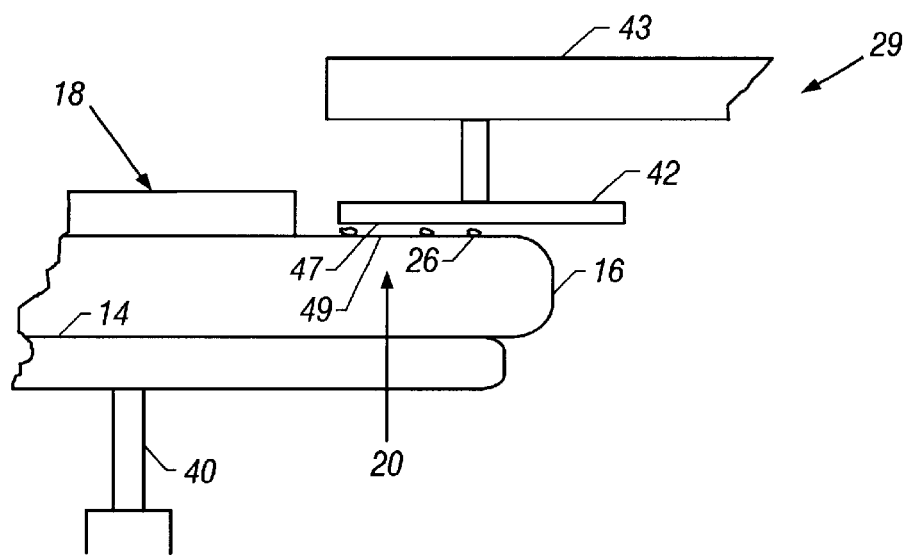
FIGS. 6A, 6B, 6C, and 6D represent illustrative examples of manufacturing a semiconductor device using the present invention.

In one illustrative embodiment, as shown in FIG. 6A, the wheel 42 may be positioned adjacent the edge region 20 of the wafer 14 with the leading edge 47 of the wheel 42 adjacent the outer edge 19 of the field region 18 of the wafer 14. Thereafter, the wafer 14 and the wheel 42 may be rotated in opposite directions (if desired) as the process of removing the defects 26 is begun. In one embodiment, the wheel 42 may be radially withdrawn at any desired speed while the wheel 42 maintains contact with the top surface 49 of the edge region 20. During this process, the wheel 42 may travel in a path that is generally parallel to the surface 49 of the edge region 20. This process may continue until the wheel 42 reaches the wafer edge 16. As the wheel 42 nears the edge 16 of the wafer 14, the wheel 42 may follow the general profile of the formed end 30 of the wafer edge 16. Of course, those skilled in the art will recognize that it is not necessary that the wheel 42 be radially withdrawn in order to remove some or all of the defects 26 existing on the edge region 20 of the wafer 14. That is, defects 26 may be removed by the rotational movement of the wheel 42 and/or wafer 14 alone, without any relative radial or translational movement between the wafer 14 and the wheel 42.

Additionally, with or without radial movement of the wheel 42 relative to the wafer 14, there may be relative vertical movement of the wheel 42 with respect to the surface 49 of the edge region 20. For example, as the wheel 42 is being radially withdrawn (if that is desired or necessary for the particular application at hand), the wheel 42 may be moved up or down relative to the surface 49 of the edge region 20. This relative vertical movement may act to form a gentle taper on the edge region 20 as the wheel 42 is withdrawn. Of course, as is readily apparent to those skilled in the art, the wheel 42 may, if desired, be withdrawn in a tangential direction from engagement with the surface 49 of the edge region 20.

Figure 6B:
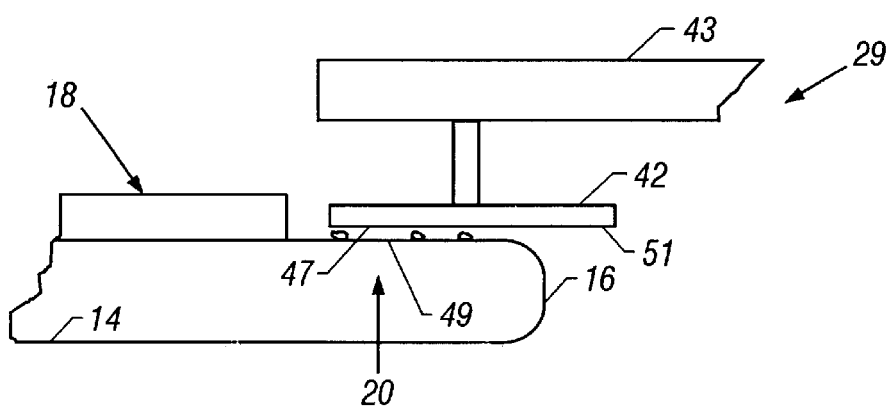
Figure 6C:
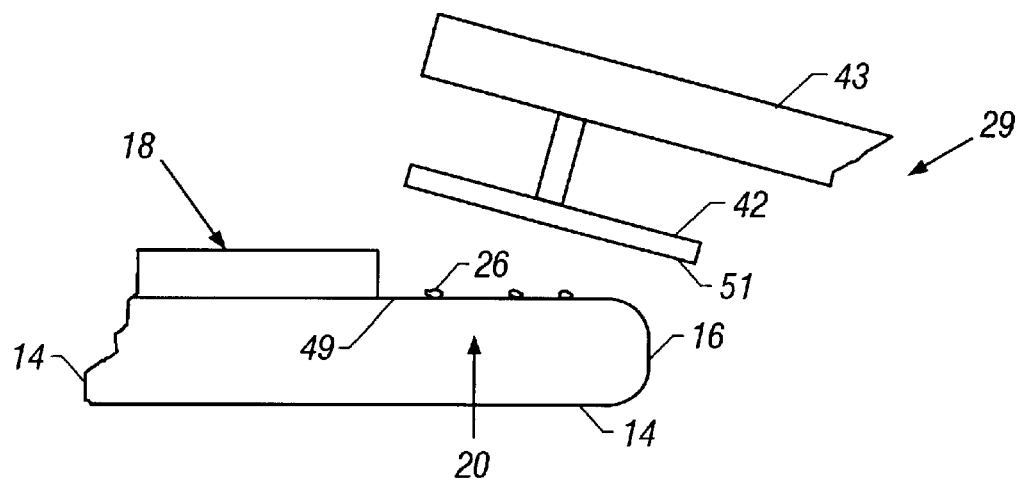
Figure 6D:
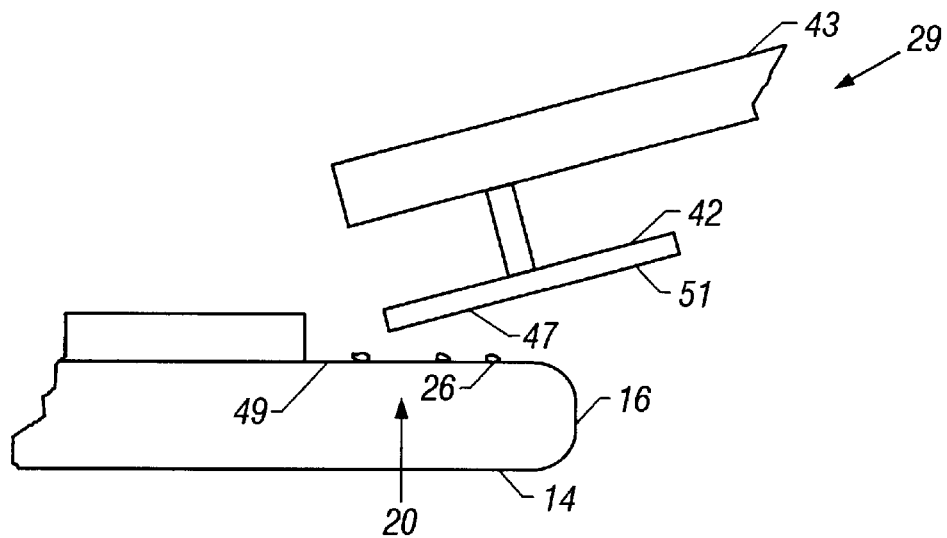

Another process variable that may be considered is the angle of the wheel 42 relative to the surface 49 of the edge region 20. As shown FIG. 6B, the face 51 of the wheel 42 may be positioned such that it is approximately parallel to the surface 49 of the edge region. Alternatively, as shown in FIG. 6C, the wheel 42 may be positioned such that the face 51 of the wheel 42 is at a slight angle relative to the surface 49 of the edge region 20. The wheel 42 could also be positioned such that the face 51 of the wheel 42 is inclined relative to the surface 49 of the edge region 20 as shown in FIG. 6D. In this configuration, the front edge 47 of the wheel 42 may be the only portion of the wheel 42 to come in contact with the surface 49 of the edge region 20.

Those skilled in the art will recognize that the position of the various components discussed above, such as the wheel 42, the surface 49 of the edge region 20, as well as the movement of the wheel 42 relative to the wafer 14, are all relative. That is, for example, instead of having the wheel 42 inclined at an angle with respect to the wafer 14, the wafer 14 could be placed on the rotating chuck 40 at an angle to the wheel 42. Similarly, any movement discussed above, such as between the wheel 42 and the wafer 14, is also relative movement. That is, the wafer 14 could be, for example, radially withdrawn from the wheel 42. Thus, the present invention should not be considered limited to the illustrative embodiments described above.

As discussed above, the wheel 42 may be positioned (for example, as shown in FIG. 6C) so as to form a gentle taper on the edge region 20. The angle of this taper may vary, and is strictly a matter of design choice. In one embodiment involving an 8 inch diameter wafer, the angle may be approximately 0.02 degrees, which corresponds to the removal of approximately 2 $\mu$m of material over a distance of approximately 6 mm. Although a matter of design choice that will vary depending upon various design considerations, any taper formed on the edge region 20 of the wafer 14 will extend radially for a distance normally on the order of millimeters, while the depth of any such taper will ordinarily be on the order of micrometers.

As disclosed above, the present invention remedies some or all of the problems inherent in the defects 26 or films that exist at the edge region 20 of the wafer 14. The present invention may be used to remove all, substantially all, or a portion of the defects 26 or films on or near the edge region 20 of the wafer 14. The present method is an affirmative process step that is specifically designed to deal with the variety of defects that arise at the edge of the wafer during normal semiconductor processing. The present technique may be employed as often as is desired during normal manufacturing operations. For example, every time the wafer 14 is subjected to a planarization process, e.g, a chemical mechanical polishing process, the edge region 20 of the wafer 14 may, at that time, also be polished to remove defects 26 and/or process layers 17 existing on the edge region 20 of the wafer 14.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for manufacturing semiconductor devices, the method comprising:

forming a plurality of process layers above a semiconductor wafer, at least some of said process layers extending onto an edge region of said wafer, said edge region having an upper surface and a plurality of defects located thereon; and selectively processing only the upper surface of only said edge region of said wafer to remove, by one of polishing, grinding and chemical mechanical polishing only the upper surface of only the edge region, at least some of said defects from the upper surface of said edge region.

2. The method as set forth in claim 1, wherein selectively processing said edge region comprises selectively polishing said edge region to remove at least some of said defects located on said edge region.

3. The method as set forth in claim 1, wherein selectively processing said edge region comprises selectively chemically mechanically polishing said edge region to remove at least some of said defects located on said edge region.

4. The method as set forth in claim 1, wherein selectively processing said edge region comprises selectively grinding said edge region to remove at least some of said defects located on said edge region.

5. The method as set forth in claim 1, wherein selectively processing said edge region comprises:

positioning said substrate adjacent a cleaning device; and actuating said cleaning device to remove at least some of said defects from said edge region.

6. The method as set forth in claim 1, wherein selectively processing said edge region comprises:

positioning said wafer adjacent a cleaning device;

engaging said edge region of said wafer with said cleaning device; and providing relative motion between said edge region of said wafer and said cleaning device.

7. A method for manufacturing semiconductor devices, the method comprising:

forming a plurality of process layers above a semiconductor wafer, said wafer having an edge region, said edge region having an upper surface and a plurality of defects formed thereon;

positioning said wafer adjacent a cleaning device; and actuating said cleaning device to remove, by one of polishing, grinding and chemical mechanical polishing only the upper surface of only the edge region, at least a portion of said defects from the upper surface of said edge region of said wafer.

8. The method of claim 7, wherein actuating said cleaning device comprises:

moving one of said cleaning device and said wafer into engagement with one another; and initiating relative movement between said cleaning device and said edge region of said wafer.

9. The method of claim 8, further comprising depositing a cleaning compound on at least one of said cleaning device and said edge region of said wafer.

10. The method of claim 8, further comprising causing both said wafer and at least a portion of said cleaning device to rotate.

11. The method of claim 7, further comprising initiating relative rotating movement between said edge region of said wafer and said cleaning device.

12. A method for manufacturing semiconductor devices, the method comprising:

positioning a semiconductor wafer adjacent a cleaning device having a polishing wheel;

engaging only an upper surface of only an edge region of said wafer with a portion of said polishing wheel, the upper surface of the edge region of the wafer having a plurality of defects thereon; and initiating relative motion between the upper surface of said edge region of said wafer and said polishing wheel to remove at least some of the defects from the upper surface of the edge region of the wafer, by one of polishing, grinding and chemical mechanical polishing only the upper surface of only the edge region.

13. The method of claim 12, wherein positioning said wafer adjacent a cleaning device comprises positioning said wafer on a rotating chuck.

14. The method of claim 12, further comprising forming a taper on said edge region of said wafer.

15. The method of claim 12, wherein initiating relative motion between said edge region of said wafer and said polishing wheel comprises initiating relative translational movement between said edge region of said wafer and said polishing wheel.

16. The method of claim 12, wherein initiating relative motion between said edge region of said wafer and said polishing wheel comprises initiating relative rotational movement between said edge region of said wafer and said polishing wheel.

17. The method of claim 12, wherein initiating relative motion between said edge region of said wafer and said polishing wheel comprises initiating relative rotational movement and relative translational movement between said edge region of said wafer and said polishing wheel.

18. The method of claim 12, wherein initiating relative motion between said edge region of said wafer and said polishing wheel comprises initiating relative vertical movement between said polishing wheel and said edge region of said wafer.

19. The method of claim 12, wherein initiating relative motion between said edge region of said wafer and said polishing wheel comprises initiating relative translational movement between said polishing wheel and said edge region of said wafer.

20. The method of claim 12, wherein initiating relative motion between said edge region of said wafer and said polishing wheel comprises initiating relative vertical and translational movement between said polishing wheel and said edge region of said wafer.

21. The method of claim 12, wherein initiating relative motion between said edge region of said wafer and said polishing wheel comprises initiating substantially parallel relative movement between said edge region and said polishing wheel.

22. The method of claim 12, wherein initiating relative motion between said edge region of said wafer and said polishing wheel comprises initiating movement of said polishing wheel at an angle relative to a top surface of said edge region.

23. The method of claim 12, wherein initiating relative motion between said edge region of said wafer and said polishing wheel comprises rotating each of said edge region of said wafer and said polishing wheel.

* * * * *